United States Patent [19]

Higgins et al.

[11] 4,390,851
[45] Jun. 28, 1983

[54] MONOLITHIC MICROWAVE AMPLIFIER HAVING ACTIVE IMPEDANCE MATCHING

[75] Inventors: J. Aiden Higgins, Westlake Village; Aditya K. Gupta, Newbury Park, both of Calif.

[73] Assignee: Rockwell International Corporation, El Segundo, Calif.

[21] Appl. No.: 210,455

[22] Filed: Nov. 25, 1980

[51] Int. Cl.³ ............................................. H03F 3/16
[52] U.S. Cl. .................................. 330/277; 330/286; 330/311
[58] Field of Search ................ 330/286, 277, 307, 311

[56] References Cited

PUBLICATIONS

Decker et al., "A Monolithic GaAs I.F. Amplifier for Integrated Receiver Applications," *1980 MTT-S International Microwave Symposium Digest*, May 1980.

*Primary Examiner*—James B. Mullins
*Attorney, Agent, or Firm*—H. Fredrick Hamann; Craig O. Malin

[57] ABSTRACT

A monolithic microwave amplifier fabricated on a GaAs substrate utilizes MESFETs to provide both gain and impedance matching. The source of a first MESFET is connected to an input terminal of the amplifier and its drain is connected to an interstage matching network. The gate of a second MESFET is connected to the output of the interstage matching network and its source is connected to the output terminal of the amplifier. Suitable voltages are applied to the MESFETs to bias the devices appropriately. The gate of the first MESFET and the drain of the second MESFET are connected in common with the grounds of the amplifier's input and output ports. In a second embodiment, additional gain is obtained by providing a third MESFET with a common source connection between the first and second MESFETs.

5 Claims, 9 Drawing Figures

FIG. 8.
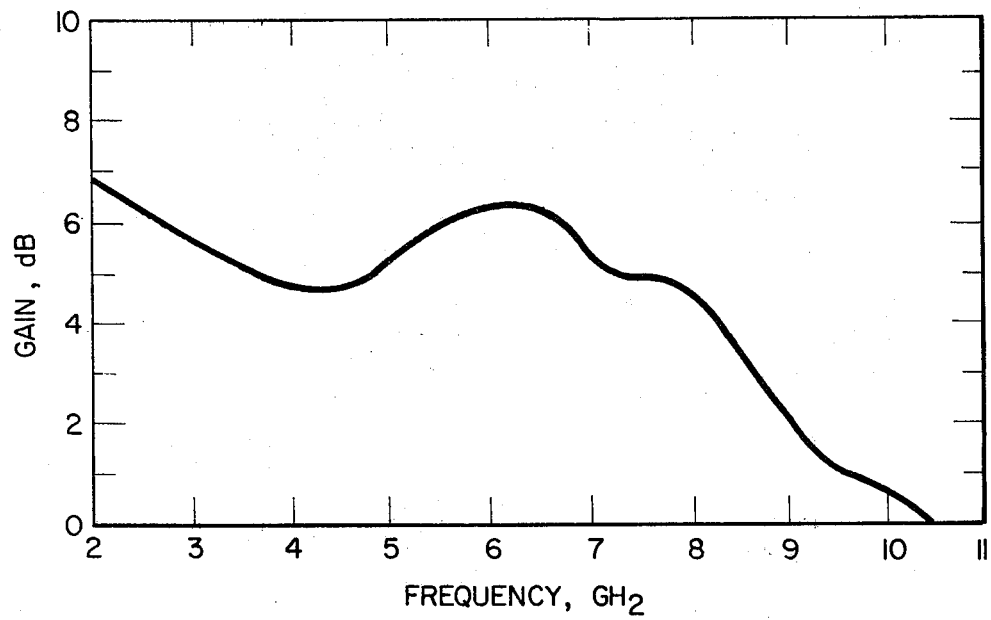
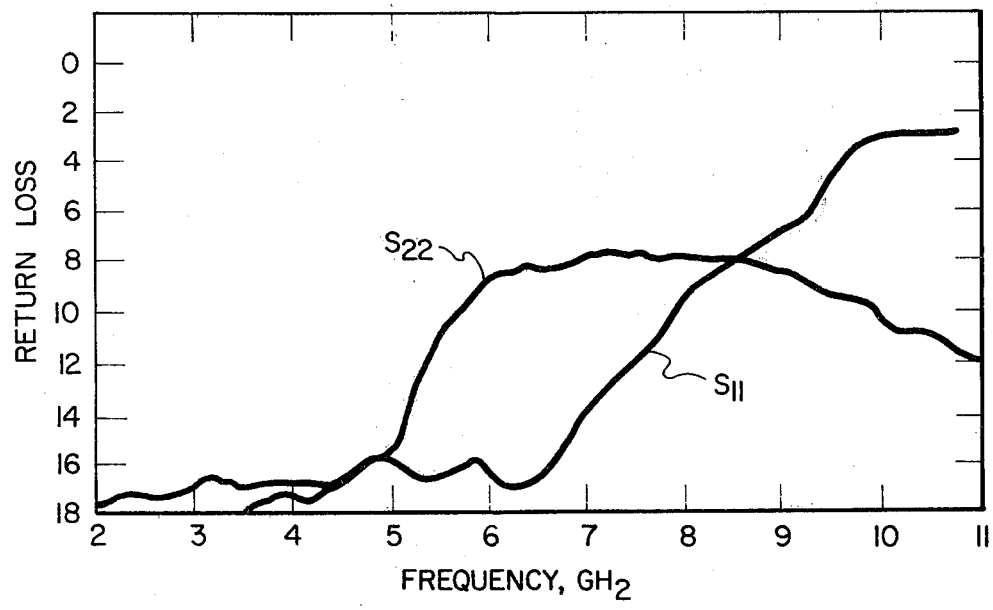
FIG. 9.

MONOLITHIC MICROWAVE AMPLIFIER HAVING ACTIVE IMPEDANCE MATCHING

STATEMENT OF GOVERNMENT INTEREST

The invention was made in the performance of work under an Army contract.

BACKGROUND OF THE INVENTION

1. Field of the Invention

This invention relates to the field of solid state electronics and particularly to the field of microwave amplifiers.

2. Description of the Prior Art

Hybrid microwave amplifiers using field effect transistors (FETs) are well known in the art. The performance of these hybrid amplifiers can be substantially increased by the monolithic integration of the FETs and the passive circuit components. Undesirable parasitic elements associated with packaged devices can be eliminated and improvements achieved in bandwidth, gain, and noise figure. Monolithic integration also eliminates wire bonds between circuit components and the necessity for fine-tuning of the circuit to obtain the desired performance. In addition, a large number of circuits can be processed in parallel.

Attempts to provide a completely monolithic microwave amplifier have encountered difficult problems. It is desirable to provide a circuit having a broadband impedance match at the input and output of the amplifier. The use of passive circuit elements to solve this problem is difficult and requires the expenditure of precious chip area. When the dimensions of microstrip and coplanar transmission lines are reduced in order to conserve space, insertion losses are increased considerably. Additionally, the construction of high Q lumped inductors is a difficult task because of the necessity of accounting for stray capacitance.

In prior art microwave amplifiers (FIG. 1), the source of the FET 1 is connected in common to both the input and output ports 2, 3 of the amplifier, an arrangement referred to as a common source connected FET. The S-parameters for the common source connected FET are shown in FIG. 2 which is a Smith chart (referred to 50 ohms) for a GaAs FET with a gate that is 1 µm long and 300 µm wide. It is noteworthy that the $S_{11}$ and $S_{22}$ parameters are generally in the high Q regions (particularly for the lower frequencies), thus making it very difficult to match them to 50 ohms over a broadband width.

SUMMARY OF THE INVENTION

It is an objective of the invention to provide an improved monolithic microwave amplifier. It is an objective of the invention to provide a monolithic microwave amplifier having active impedance matching.

It is an objective of the invention to provide a monolithic microwave amplifier having a broadband impedance match at the input together with gain.

It is an objective of the invention to provide a monolithic microwave amplifier having a low loss, broadband impedance match at the output.

It is an objective of the invention to provide a monolithic microwave amplifier having moderate input impedance together with gain and a low noise figure over large band widths.

According to the invention, at least two FETs are fabricated on a suitable semiconductor substrate. In a common gate-common drain embodiment of the invention, the gate of the FET on the input side of the amplifier and the drain of the FET on the output side are both connected in common. The source of the input FET is connected to an input terminal of the amplifier and its drain is connected to an interstage matching network. The gate of the output FET is connected to the output of the interstage matching network and its source is connected to the output terminal of the amplifier. Suitable voltages are applied to the electrodes of the FETs to bias the devices for appropriate gain and noise performance.

The common gate nput FET provides a moderate input impedance together with gain and a low noise figure over large band widths. The common drain output FET provides a moderate output impedance with low loss. This arrangement eliminates the need for elaborate, broadband, passive input/output matching networks.

In a common gate-common source-common drain embodiment of the amplifier, additional gain is obtained by adding a third FET with a common source connection between the input and output FETs. The gate of this third FET is joined to the drain of the input FET through the interstage matching network and its drain is joined to the gate of the output FET through a second interstage matching network.

These and other objects and features of the invention will be apparent from the following detailed description taken with reference to the accompanying drawings.

BRIEF DESCRIPTION OF THE DRAWINGS

FIG. 8 shows the measured gain vs frequency for a monolithic amplifier circuit such as shown in FIG. 4; and FIG. 9 shows the measured input and output port return loss of the same monolithic amplifier as measured in FIG. 8.

DESCRIPTION OF THE PREFERRED EMBODIMENTS

In this invention, field effect transistors (FETs) are used to achieve the required broadband input and output impedance match in monolithic microwave amplifiers. These active devices consume a much smaller area than passive components performing the same function.

Figure 3:
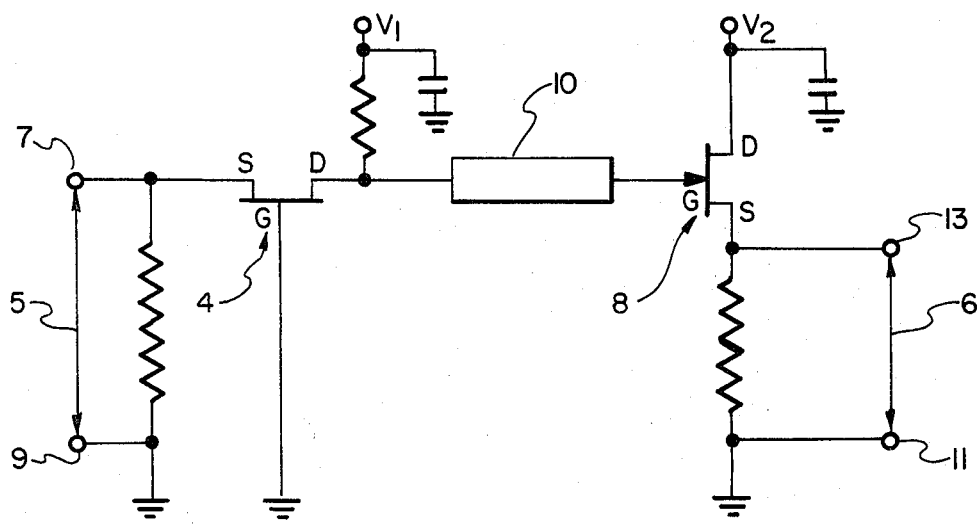
FIG. 3 is a circuit diagram of a common gate-common drain embodiment of the invention.

FIG. 3 is a circuit diagram of a two FET embodiment of the invention. The first FET 4 on the input side of the amplifier has its source connected to a signal input terminal 7 of output port 5 and its gate connected in common with ground terminals 9, 11 of both input port 5 and output port 6. Its drain is positively biased with respect to its source by voltage $V_1$. The drain is connected to the gate of a second FET 8 on the output side of the amplifier through an interstage matching network 10. In FIG. 3, interstage matching network 10 is a short section of high impedance transmission line (200 ohms, 110° at 10 GHz).

Second FET 8 has its drain connected via a bypass capacitor in common with input ground terminal 9 and output ground terminal 11 and with the gate of FET 4. For high frequency signals, the bypass capacitor assures that the drain is grounded. The drain is connected to voltage $V_2$ in order to bias the drain positively with respect to the source. The source of FET 8 is connected to signal output terminal 13.

The arrangement shown in FIG. 3 is termed a common gate-common drain connection because the gate of the first FET and the drain of the second FET are connected in common with the ground terminals of both the input and the output of the amplifier. In this circuit the first FET provides a moderate input impedance together with gain and a low noise figure, while the second FET provides a moderate output impedance with low loss.

Figure 4:
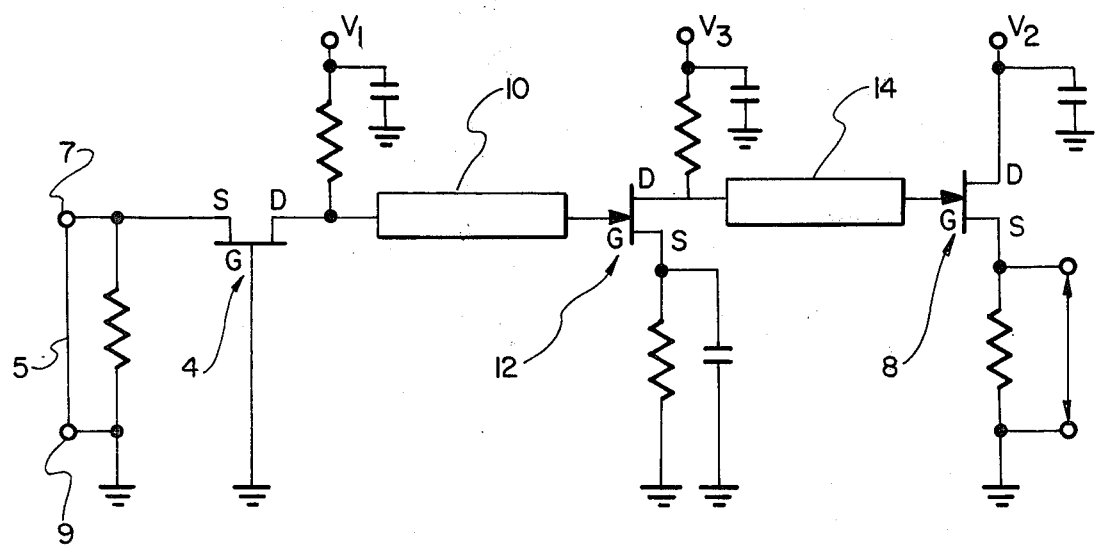
FIG. 4 is a circuit diagram of a common gate-common source-common drain embodiment of the invention.

In a three FET embodiment of the invention, a third FET 12 is placed between FET 4 and FET 8 to provide additional gain. The drain of FET 12 is connected to the gate of FET 8 using a second interstage matching device 14 and is biased positively by voltage $V_3$ as shown in FIG. 4. Its source is connected in common with the grounded input and output terminals in the usual prior art arrangement. This embodiment is termed a common gate-common source-common drain connection.

The reason FETs can perform the task of impedance matching is because their microwave S-parameters are dependent upon the method of connection and upon the geometry of the devices. This dependency is shown for several connections in FIGS. 2 and 5-7. These figures are Smith charts (referred to 50 ohms) for a GaAs FET with a gate that is 1 $\mu$m long and 300 $\mu$m wide. In these Smith charts the numbers next to the solid dots on the S-parameter curves are the frequency in GHz. The valves for some of the S-parameter curves have been multiplied as shown by the multiplier to more clearly show them on the chart.

Figure 1:
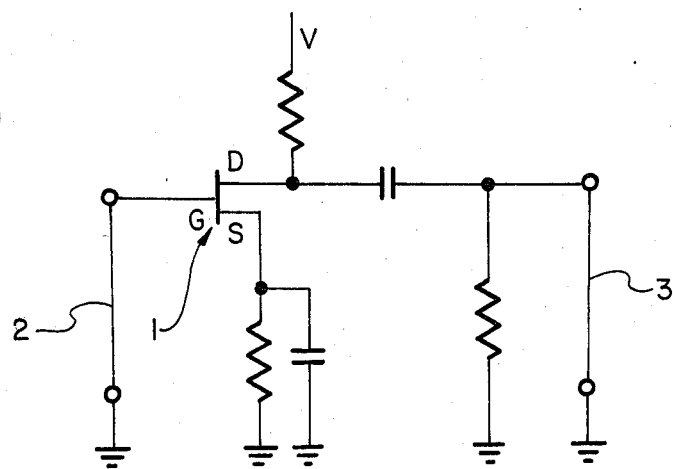
FIG. 1 is a circuit diagram of a prior art, hybrid microwave amplifier using a FET in a common source connection.
Figure 2:
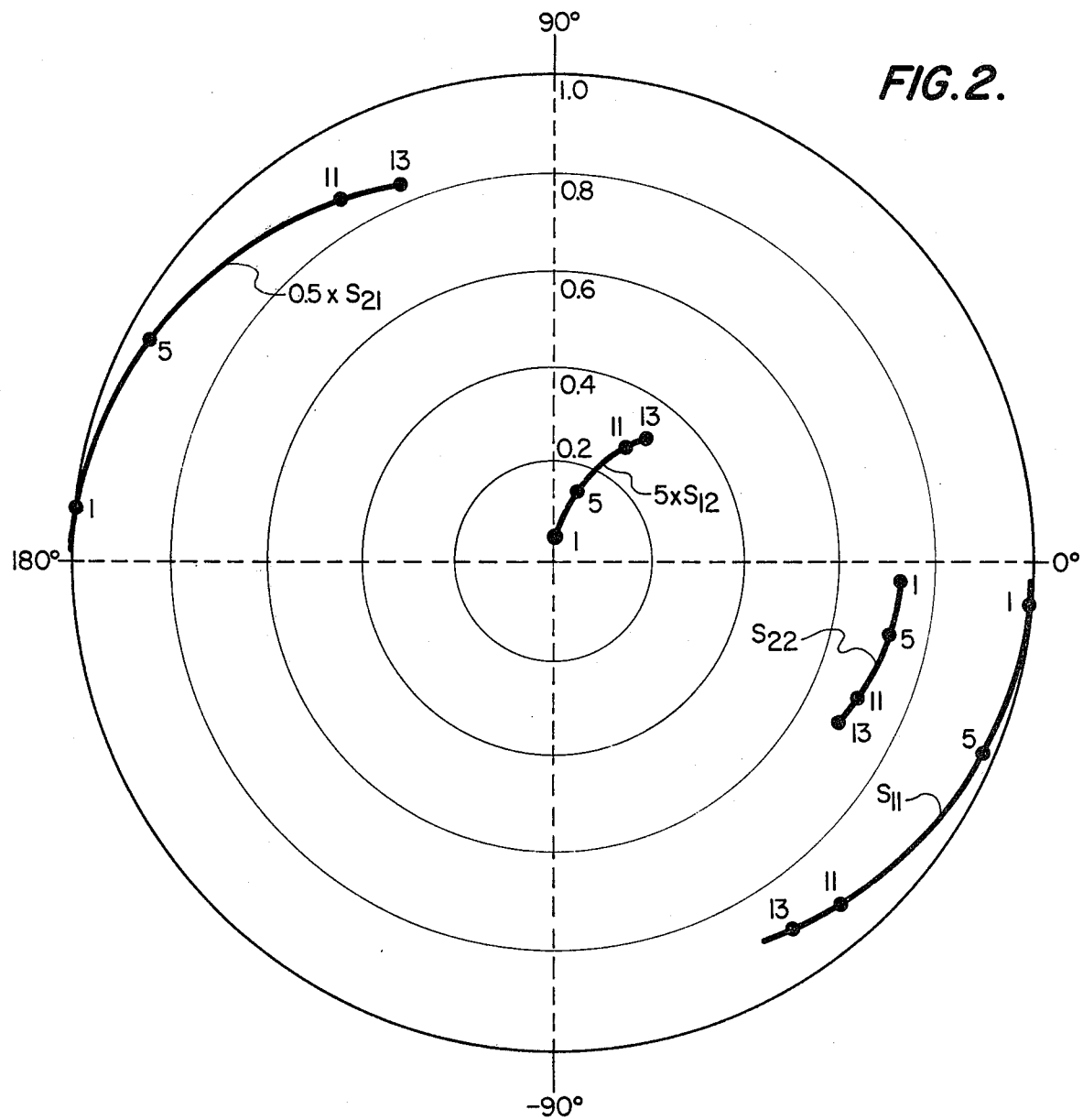
FIG. 2 is a Smith chart showing the S-parameters of a bare GaAs FET in the common source configuration.

FIG. 2 shows the impedance matching problem presented by the prior art common source connection. The $S_{11}$ and $S_{22}$ parameters are generally in the high Q region of the chart, particularly for the lower frequencies. This makes it very difficult to match common source connected FETs to a moderate impedance such as 50 ohms over a broad bandwidth.

Figure 5:
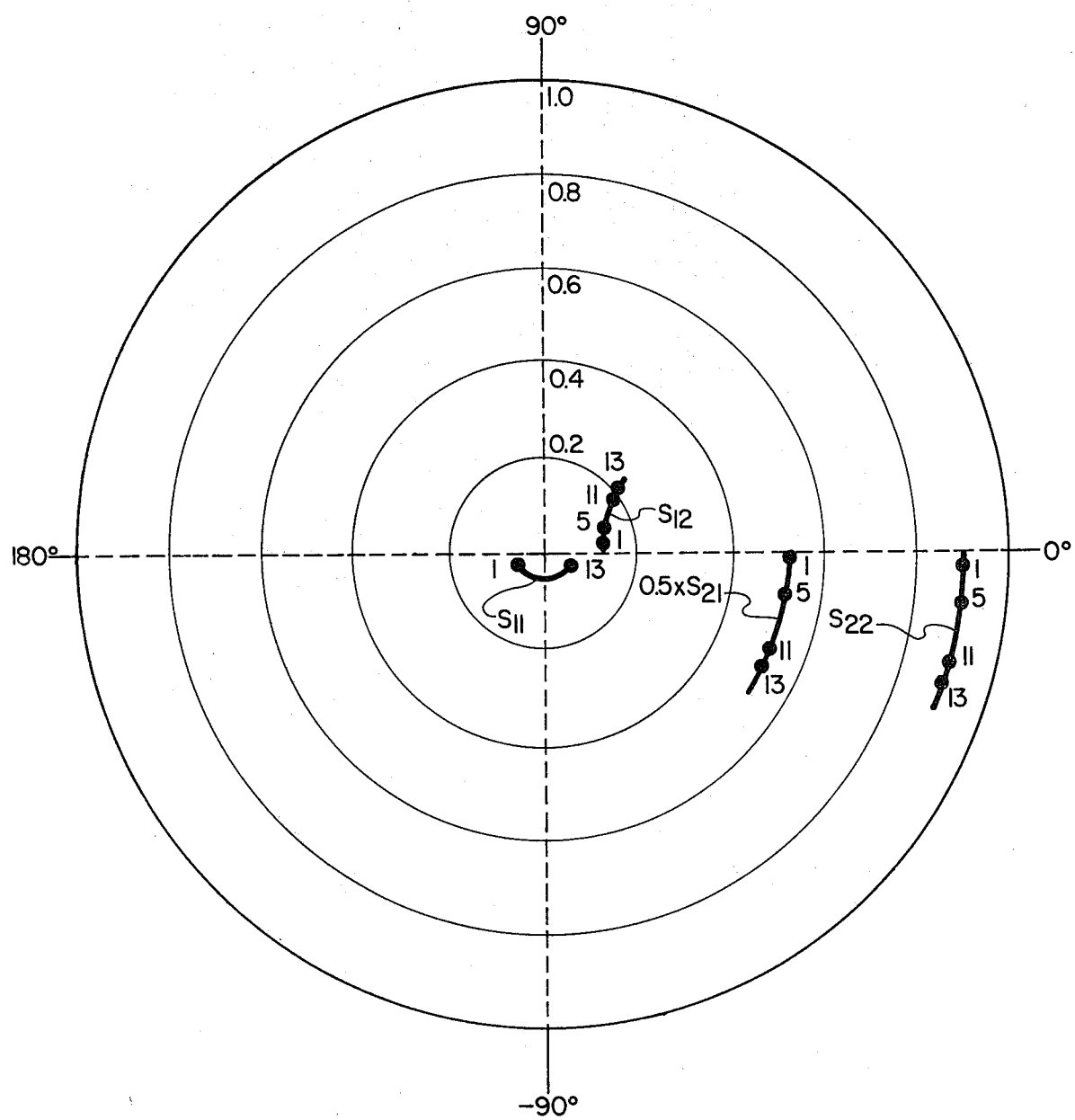
FIG. 5 is a Smith chart showing the S-parameters of the same FET as used in FIG. 2 except measured in the common gate connection.

FIG. 5 shows the S-parameters of the same FET in the common gate connection (such as FET 4 in the circuit of FIG. 3). The noteworthy feature of this connection is the close proximity of $S_{11}$ of the 50 ohm center of the chart. The control of FET width and thus the transconductance ($g_m$) is the key to obtaining this good match. The input impedance of a common gate connected FET (without any packaging parasitics) is approximately $1/g_m$ at low frequencies. Thus, by choosing a FET width to give $g_m = 20$ millisiemens, an input impedance of 50 ohms is obtained. By varying the width of the FET, other input impedances can also be achieved. As shown in FIG. 5, the input impedance remains close to 50 ohms until fairly high frequencies. The upper end of this frequency range can be increased by reducing the gate length of the FET.

Figure 6:
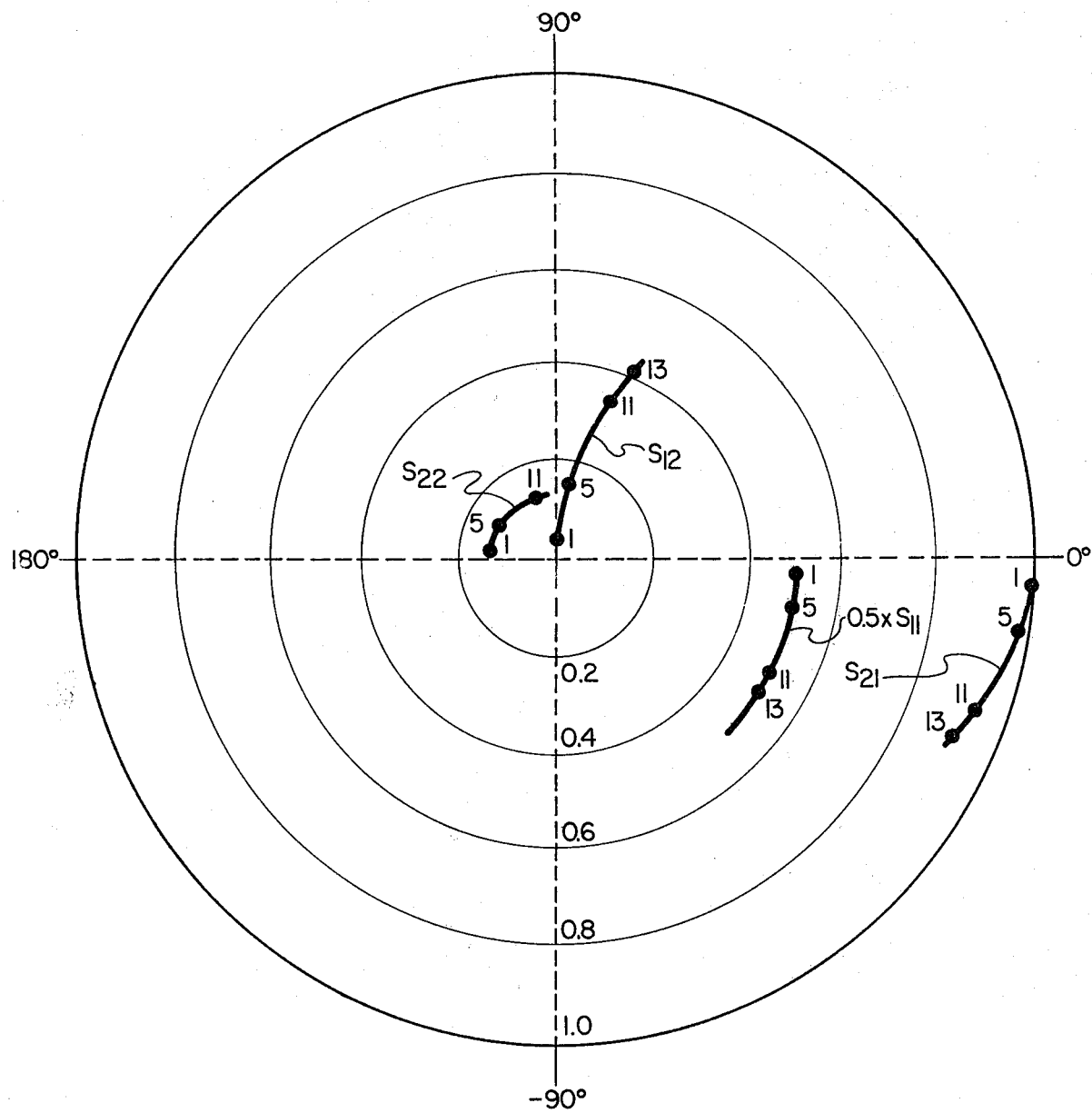
FIG. 6 is a Smith chart showing the S-parameters of the same FET as used in FIG. 2 except measured in the common drain connection.

FIG. 6 shows the S-parameters of the same FET in the common drain connection (such as FET 8 in FIG. 3). In this connection, $S_{22}$ is close to the 50 ohm center of the Smith chart. The output impedance of a common drain connected FET (without any packaging parasitics) is approximately $1/g_m$ at low frequencies. By choosing the transconductance $g_m$ to be 20 mS as noted above, a match to 50 ohms can be achieved at the output. Once again, the match remains good for fairly high frequencies, and can be improved by reducing the gate length of the FET.

Figure 7:
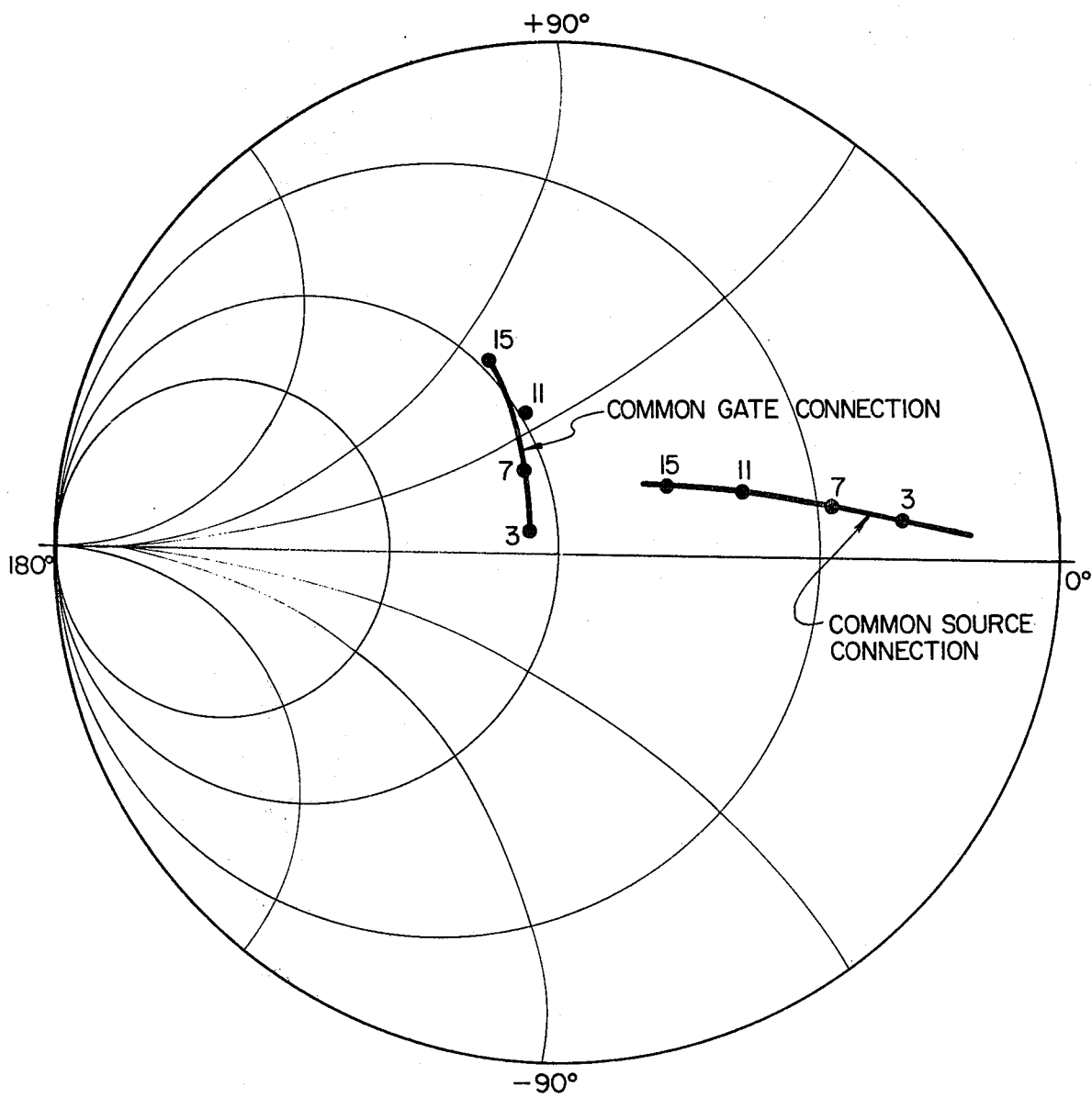
FIG. 7 is a Smith admittance chart showing the optimum source admittance for both a common source connection and for a common gate connection.

The noise figure at the input of an amplifier is always a concern. FIG. 7 shows the optimum signal generator admittances for both the common source connection and for the common gate connection. As shown in FIG. 7, the optimum signal generator impedance for a noise match is more readily obtainable over wide bandwidths for the common gate connection. Because the optimum signal generator impedance for a noise match is close to the center of the Smith chart, it is possible to obtain a reasonable noise match and an impedance match over broad bandwidths by using the common gate connection at the input of the amplifier.

The fabrication of circuits shown in FIGS. 3 and 4 utilizes an established technology for making metal semiconductor FET (MESFET) devices by the use of ion implanted layers, a mesa approach, and standard ohmic contacts. The substrate used in fabricating the devices was semi-insulating GaAs.

The gates fabricated for the devices illustrated herein were from 0.50 $\mu$m to 1.0 $\mu$m in length. Electron beam lithography (EBL) was used to define the gate pattern in PMMA. Between the PMMA and the surface of the drain source gap there was a 5000 Å thick layer of $Si_3N_4$. This was plasma etched after the EBL development step. In so doing, the insulator was undercut, thus aiding in lifting away unwanted metal without tearing.

The resistors were formed using the same implant that was used to fabricate the FET active layer. Many resistor mesas were formed and the desired resistance was selected during the EBL step by connecting the appropriate number in parallel or in series. The use of 1000 ohms/square implanted material for resistors poses certain problems that must be taken into account. In the case of resistors that carry no current they can be made small, but resistors carrying the drain-source current must be quite large and can have an appreciable capacitance to a ground plane in the microstrip configuration. In the designs illustrated herein, a coplanar approach was adopted to avoid such ground plane problems and to facilitate RF grounding of the active devices.

The capacitors were metal-insulator-metal (MIM) capacitors which utilized a plasma deposited $Si_3N_4$ dielectric. This nitride was 5000 Å thick (same layer as used in gate definition) and had a low pinhole density. Capacitance was 150 pF/mm$^2$.

The 2 GHz to 10 GHz gain for a common gate-common source-common drain amplifier (FIG. 4) fabricated as described above is shown in FIG. 8. The gain is compromised in flatness and magnitude by the difficulty of obtaining a sufficiently high impedance transmission line in the coplanar format. Nevertheless, a useful and substantial broadband gain was obtained.

The return losses for the input and output ports of the amplifier are shown in FIG. 9. These return losses are quite acceptable over the designed bandwidths.

Numerous variations and modifications can be made in the design and fabrication of the amplifier without departing from the invention. For example, interstage networks of a more complex design utilizing lumped inductors can be used to flatten out the gain. FETs with shorter gate lengths, and interstage tuning by series inductance can be used to change the performance. Different monolithic fabricating techniques and substrates can be used. Accordingly, it should be clearly understood that the form of the invention described above and shown in the accompanying drawings is illustrative only and is not intended to limit the scope of the invention.

What is claimed is:

1. A monolithic microwave amplifier comprising:
   an input port having a signal input terminal and an input ground terminal;
   an output port having a signal output terminal and an output ground terminal;
   a first field effect transistor having a source coupled to said signal input terminal, a gate, and a drain which is positively biased with respect to said source of said first field effect transistor;
   an interstage matching network having its input end connected to said drain of said first field effect transistor;
   a second field effect transistor having a gate connected to the output end of said interstage matching circuit, a source coupled to said signal output terminal, and a drain which is positively biased with respect to said source of said second field effect transistor;
   said input ground terminal, said gate of said first field effect transistor, said drain of said second field effect transistor and said output ground terminal, all being connected in common.

2. The amplifier as claimed in claim 1, wherein said first and second field effect transistors and said interstage matching networks are circuits on a monolithic GaAs substrate.

3. The amplifier as claimed in claim 1, wherein said first and second field effect transistors have gates that are 1 $\mu$m or less in length.

4. The amplifier as claimed in claim 1, wherein said interstage matching network has an impedance of at least 200 ohms.

5. A monolithic microwave amplifier comprising:
   an input port having a signal input terminal and an input ground terminal;
   an output port having a signal output terminal and an output ground terminal;
   a first field effect transistor having a source coupled to said signal input terminal, a gate, and a drain which is positively biased with respect to said source of said first field effect transistor;
   a first interdevice matching network having its input end connected to said drain of said first field effect transistor;
   a second field effect transistor having a gate connected to the output end of said first interstage network, a source, and a drain which is positively biased with respect to said source of said second field effect transistor;
   a second interstage matching network having its input end connected to said drain of said second field effect transistor;
   a third field effect transistor having a gate connected to the output end of said second interstage matching network, a source coupled to said signal output terminal, and a drain which is positively biased with respect to said source of said third field effect transistor;
   said input ground terminal, said gate of said first field effect transistor, said source of said second field effect transistor, said drain of said third field effect transistor, and said output ground terminal all being connected in common.

* * * * *